United States Patent
Hsiao et al.

(10) Patent No.: US 7,894,566 B2
(45) Date of Patent: Feb. 22, 2011

(54) SHIFT REGISTER APPARATUS

(75) Inventors: Chao-Chih Hsiao, Taipei (TW); Yen-Po Chen, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 48 days.

(21) Appl. No.: 12/504,665

(22) Filed: Jul. 17, 2009

(65) Prior Publication Data
US 2010/0272228 A1  Oct. 28, 2010

(30) Foreign Application Priority Data
Apr. 23, 2009 (TW) .............................. 98113531 A (51) Int. Cl.
*G11C 19/00* (2006.01)
(52) U.S. Cl. .............................. 377/64; 377/68; 377/69
(58) Field of Classification Search ...................... None
See application file for complete search history.

(56) References Cited

U.S. PATENT DOCUMENTS

| | | | | |
|---|---|---|---|---|
| 3,937,982 A * | 2/1976 | Nakajima | ..................... | 326/98 |
| 4,017,741 A * | 4/1977 | Briggs | ......................... | 377/79 |
| 6,556,646 B1 * | 4/2003 | Yeo et al. | ....................... | 377/54 |
| 7,027,551 B2 * | 4/2006 | Han et al. | ..................... | 377/69 |
| 2004/0227718 A1 * | 11/2004 | Park | ............................ | 345/100 |
| 2005/0220262 A1 * | 10/2005 | Moon | ........................... | 377/64 |
| 2008/0062097 A1 * | 3/2008 | Jeong et al. | .................. | 345/84 |

* cited by examiner

*Primary Examiner*—Tuan Lam
(74) *Attorney, Agent, or Firm*—Jianq Chyun IP Office (57) ABSTRACT

A shift register apparatus is provided. Each of shift registers within the shift register apparatus of the present invention is only constituted by a few of active and passive elements without using conventional digital logic elements, and even the passive element are not required at some conditions. Therefore, the layout area occupied/consumed by each of the shift registers of the present invention is relatively smaller than that of the conventional shift register constituted by a CMOS D-flip-flop, and thus a fabrication cost can be reduced.

17 Claims, 11 Drawing Sheets

SHIFT REGISTER APPARATUS

CROSS-REFERENCE TO RELATED APPLICATION

This application claims the priority benefit of Taiwan application serial no. 98113531, filed Apr. 23, 2009. The entirety of the above-mentioned patent application is hereby incorporated by reference herein and made a part of specification.

BACKGROUND OF THE INVENTION

1. Field of the Invention

The present invention relates to a driving apparatus of a flat panel display. More particularly, the present invention relates to a shift register apparatus of a liquid crystal display.

2. Description of Related Art

Recently, with booming development of the semiconductor technology, portable electronic products and flat panel displays are widely used. Among various kinds of flat panel displays, the liquid crystal displays (LCDs) having the features of low operation voltage, no radiation, light-weight, small-size, etc. become a mainstream of display products.

Conventionally, a gate driver, fabricated on a Y-board (i.e. a printed circuit board), for turning on active devices of each pixel row in an LCD panel is constituted by a plurality of shift registers connected in serial and. Generally, each of the registers is implemented by a complementary metal-oxide semiconductor (CMOS) D-flip-flop.

However, it is known that each of the CMOS D-flip-flop requires a large amount of digital logic elements, such as NAND gates, NOT gates, and transmission gates, etc. Therefore, the higher a resolution of the LCD panel is, the bigger layout area the gate driver fabricated on the Y-board occupies, and accordingly a fabrication cost is increased.

SUMMARY OF THE INVENTION

Accordingly, the present invention is directed to a shift register apparatus, in which each of shift registers is only constituted by a few of active and passive elements, so that a layout area occupied/consumed by each of the shift registers can be greatly reduced.

The present invention provides a shift register apparatus including a plurality of shift registers connected in serial. Each of the shift registers has a first input terminal and an output terminal, wherein an output terminal of an i-th shift register is coupled to a first input terminal of an (i+1)-th shift register, and i is a positive integer.

In an embodiment of the present invention, the i-th shift register includes a first to a fourth transistor and a capacitor. A gate of the first transistor receives a first clock signal, and a first drain/source of the first transistor receives a first voltage. A gate of the of the second transistor serves as a first input terminal of the i-th shift register and is coupled to an output terminal of an (i−1)-th shift register, a first drain/source of the second transistor is coupled to a second drain/source of the first transistor, and a second drain/source of the second transistor is coupled to a second voltage.

A first terminal of the capacitor is coupled to the second drain/source of the first transistor, and a second terminal of the capacitor is coupled to the second voltage. A gate of the third transistor is coupled to the first terminal of the capacitor, a first drain/source of the third transistor receives a second clock signal, and a second drain/source of the third transistor serves as an output terminal of the i-th shift register. A gate of the fourth transistor is coupled to the gate of the third transistor, a first drain/source of the fourth transistor is coupled to the second drain/source of the third transistor, and a second drain/source of the fourth transistor is coupled to the second voltage.

In an embodiment of the present invention, the first and the third transistors are respectively a first-type transistor, and the second and the fourth transistors are respectively a second-type transistor.

In an embodiment of the present invention, a cycle of the first clock signal is at least twice the bigger than that of the second clock signal.

The present invention provides a gate driver having the aforementioned shift register apparatus, and a liquid crystal display (LCD) having the gate driver.

In the present invention, each of the shift registers within the shift register apparatus is only constituted by a few of active and passive elements (i.e. P-type and N-type transistors and capacitors) without using the conventional digital logic elements, and even the passive elements are not required at some conditions (which will be described later). Therefore, the layout area occupied/consumed by each of the shift registers of the present invention is relatively smaller than that of the conventional shift register constituted by the CMOS D-flip-flop, and thus the fabrication cost can be reduced.

In order to make the aforementioned and other features and advantages of the present invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the present invention, examples of which are illustrated in the accompanying drawings, wherein like reference numerals refer to the like elements throughout.

Figure 1:
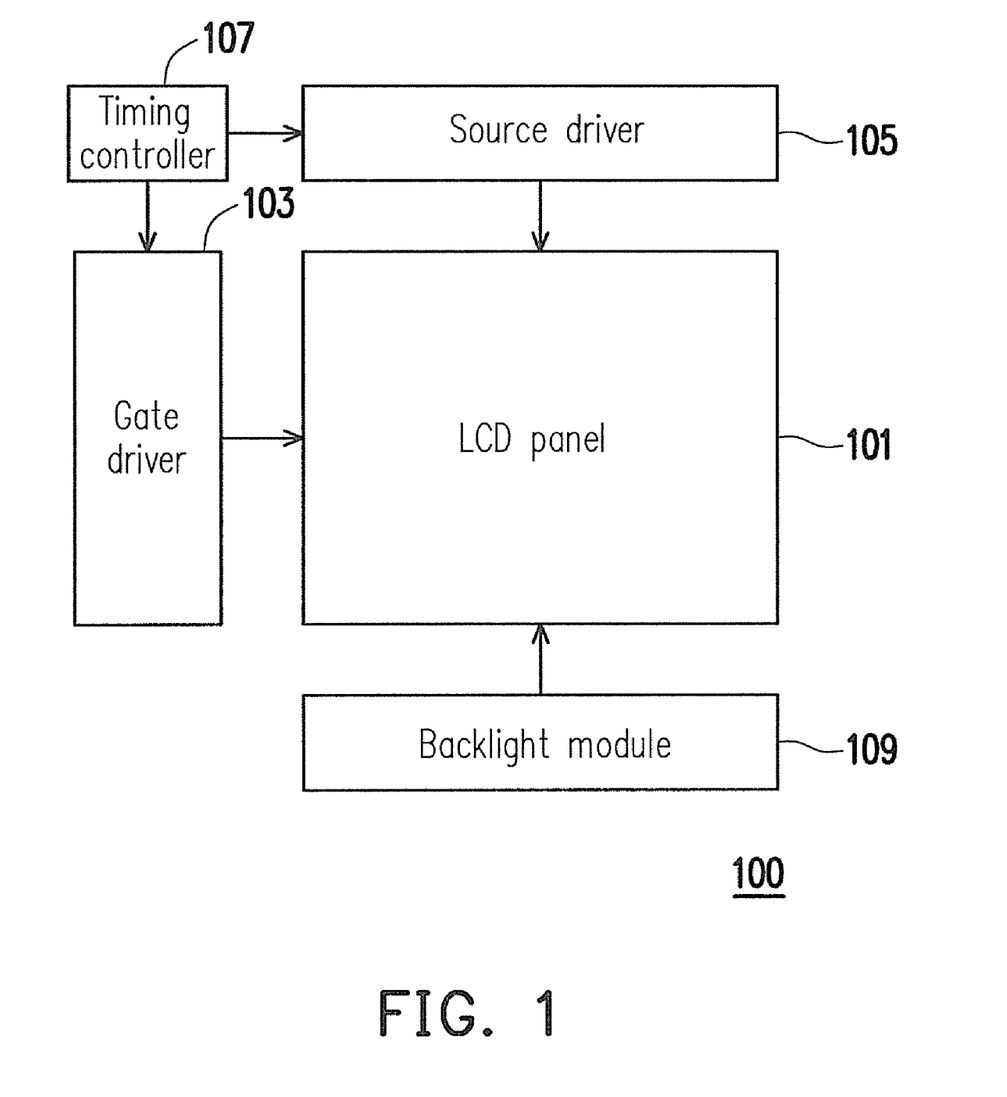
FIG. 1 is a system block diagram illustrating a liquid crystal display (LCD) 100 according to an exemplary embodiment of the present invention.

FIG. 1 is a system block diagram illustrating a liquid crystal display (LCD) 100 according to an exemplary embodiment of the present invention. Referring to FIG. 1, the LCD 100 includes an LCD panel 101, a gate driver 103, a source driver 105, a timing controller 107, and a backlight module 109. The LCD panel 101 has a plurality of pixels (not shown) arranged in an array.

The gate driver 103 is coupled to the LCD panel 101, and is used for sequentially generating a scan signal to turn on active devices, for example, thin-film transistors (TFT), of each pixel row within the LCD panel 101. The source driver 105 is coupled to the LCD panel 101 for providing a corresponding data voltage (which is also referred to as a pixel voltage) to the pixel row turned on by the gate driver 103. The timing controller 107 is coupled to the gate driver 103 and the source driver 105, and is used for controlling operations of the gate driver 103 and the source driver 105.

According to the related art, it is known that each of the shift register is implemented by the CMOS D-flip-flop. However, since each of the CMOS D-flip-flop requires a large amount of digital logic elements, the higher a resolution of the LCD panel is, the bigger the layout area the gate driver and the source driver occupy/consume, and accordingly a fabrication cost is increased. Therefore, to reduce the fabrication cost, the present invention provides a simplified shift register, so as to greatly reduce the layout area.

Figure 2:
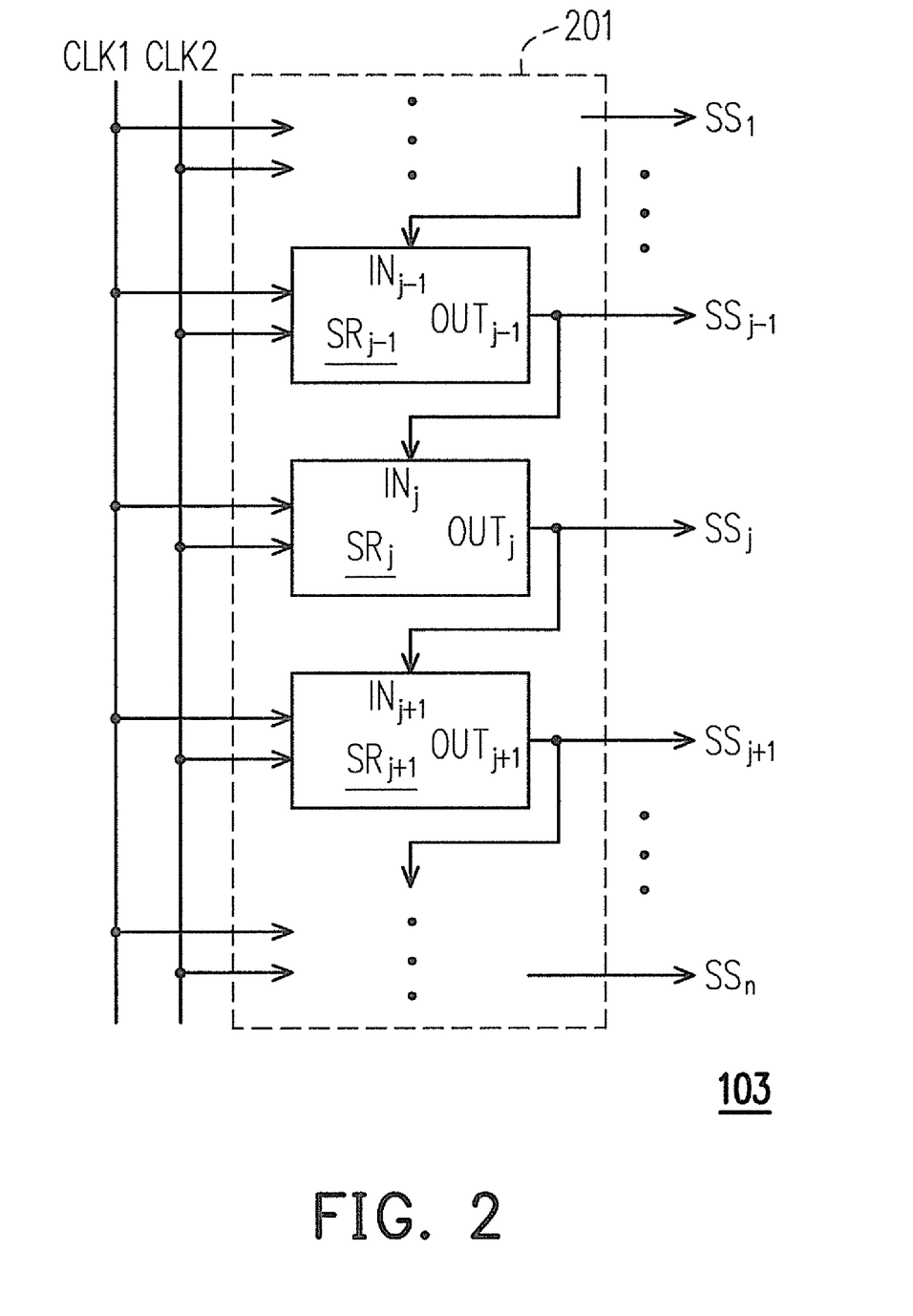
FIG. 2 is a schematic diagram illustrating a shift register apparatus 201 according to an exemplary embodiment of the present invention.

FIG. 2 is a schematic diagram illustrating a shift register apparatus 201 according to an exemplary embodiment of the present invention. The shift register apparatus 201 has a plurality of shift registers (only three shift registers $SR_{j-1}$, $SR_j$ and $SR_{j+1}$ are illustrated in FIG. 2 for description) connected in serial, and each of the shift registers has a input terminal and an output terminal. The output terminal of an i-th shift register is coupled to the input terminal of an (i+1)-th shift register. For example, an output terminal $OUT_{j-1}$ of the shift register $SR_{j-1}$ is coupled to an input terminal $IN_j$ of the shift register $SR_j$, an output terminal $OUT_j$ of the shift register $SR_j$ is coupled to an input terminal $IN_{j+1}$ of the shift register $SR_{j+1}$, and others are deduced by analogy, so that detailed descriptions thereof are not repeated.

Moreover, in the present embodiment, since circuit structures of the shift registers in the shift register apparatus 201 are similar, only a single shift register is selected for description.

Figure 3:
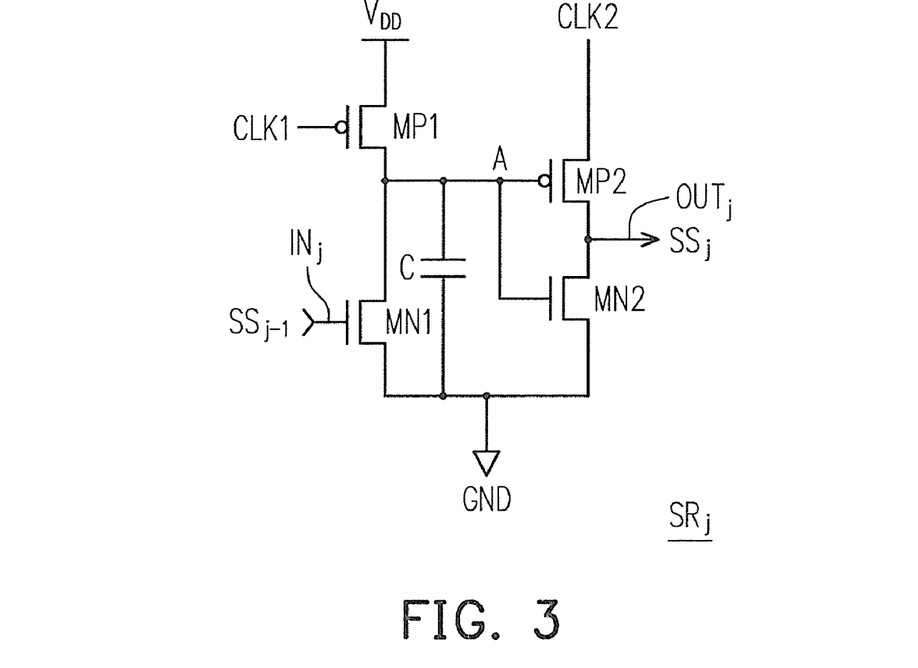
FIG. 3 is a circuit diagram of a shift register $SR_j$ according to an exemplary embodiment of the present invention.

FIG. 3 is a circuit diagram of the shift register $SR_j$ according to an exemplary embodiment of the present invention. Referring to FIGS. 1 to 3, the shift register $SR_j$ includes P-type transistors MP1 and MP2, N-type transistors MN1 and MN2 and a capacitor C. A gate of the P-type transistor MP1 receives a clock signal CLK1, and a first drain/source of the P-type transistor MP1 receives a system voltage $V_{DD}$ of the LCD 100.

A gate of the N-type transistor MN1 serves as the input terminal $IN_j$ of the shift register $SR_j$ and is coupled to the output terminal $OUT_{j-1}$ of the shift register $SR_{j-1}$, a first drain/source of the N-type transistor MN1 is coupled to a second drain/source of the P-type transistor MP1, and a second drain/source of the N-type transistor MN1 is coupled to a reference voltage (for example, a ground voltage GND, though the present invention is not limited thereto). A first terminal of the capacitor C is coupled to the second drain/source of the first P-type transistor MP1, and a second terminal of the capacitor C is coupled to the reference voltage (i.e. the ground voltage GND).

A gate of the P-type transistor MP2 is coupled to the first terminal of the capacitor C, a first drain/source of the P-type transistor MP2 receives a clock signal CLK2, and a second drain/source of the P-type transistor MP2 serves as the output terminal $OUT_j$ of the shift register $SR_j$. A gate of the N-type transistor MN2 is coupled to the gate of the P-type transistor MP2, a first drain/source of the N-type transistor MN2 is coupled to the second drain/source of the P-type transistor MP2, and a second drain/source of the N-type transistor MN2 is coupled to the reference voltage (i.e. the ground voltage GND).

According to the aforementioned description of the circuit structure of the shift register $SR_j$, those skilled in the art should be able to deduce a whole structure of the shift register apparatus 201, and therefore detailed descriptions thereof are not repeated.

Figure 4:
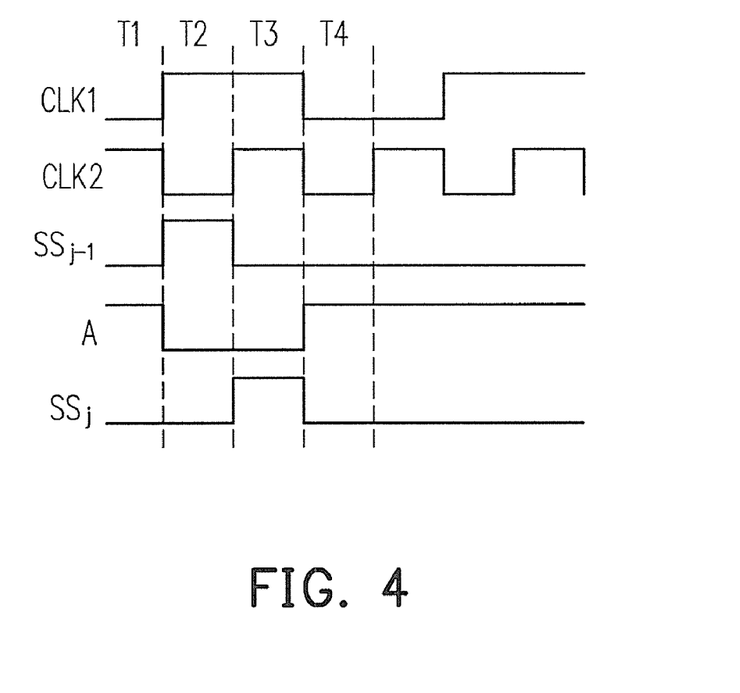
FIG. 4 is an operation timing diagram of a shift register $SR_j$ according to an exemplary embodiment of the present invention.

Moreover, FIG. 4 is an operation timing diagram of the shift register $SR_j$ according to an exemplary embodiment of the present invention. Referring to FIGS. 3 and 4, according to FIG. 4, it is obvious that a cycle of the clock signal CLK1 is twice the bigger than that of the clock signal CLK2, and during a time section T1 in a frame period of the LCD 100, the clock signal CLK1 has a low voltage level, the clock signal CLK2 has a high voltage level, and a scan signal $SS_{j-1}$ output by the shift register $SR_{j-1}$ has the low voltage level.

Therefore, the P-type transistor MP1 is turned on, and the system voltage $V_{DD}$ can charge the capacitor C, so that a voltage level of a node A located on a coupling path between the second drain/source of the P-type transistor MP1 and the gate of the P-type transistor MP2 is pulled up to the high voltage level. Such that, the P-type transistor MP2 is turned off, and the N-type transistor MN2 is turned on, so that the scan signal $SS_j$ output by the shift register $SR_j$ during the time section T1 has the low voltage level.

Thereafter, during a time section T2 of the same frame period, the clock signal CLK1 has the high voltage level, the clock signal CLK2 has the low voltage level, and the scan signal $SS_{j-1}$ output by the shift register $SR_{j-1}$ has the high voltage level. Therefore, the P-type transistor MP1 is turned off, and the N-type transistor MN1 is turned on, so that charges stored in the capacitor C during the time section T1 are discharged, and the voltage level of the node A is pulled down to the low voltage level. Since the voltage level of the node A is pulled down to the low voltage level during the time section T2, the P-type transistor MP2 is turned on, and the N-type transistor MN2 is turned off, so that the scan signal $SS_j$ output by the shift register $SR_j$ during the time section T2 has the low voltage level.

Next, during a time section T3 of the same frame period, the clock signal CLK1 has the high voltage level, the clock signal CLK2 has the high voltage level, and the scan signal $SS_{j-1}$ output by the shift register $SR_{j-1}$ has the low voltage level. Therefore, the P-type transistor MP1 and the N-type transistor MN1 are all turned off, so that the voltage level of the node A is maintained to the low voltage level during the time section T3. Since the voltage level of the node A is maintained to the low voltage level during the time section T3, the P-type transistor MP2 is still turned on, and the N-type transistor MN2 is still turned off, so that the scan signal $SS_j$ output by the shift register $SR_j$ during the time section T3 has the high voltage level.

Thereafter, during a time section T4 of the same frame period, the clock signals CLK1 and CLK2 all have the low voltage level, and the scan signal $SS_{j-1}$ output by the shift register $SR_{j-1}$ also has the low voltage level. Therefore, the P-type transistor MP1 is turned on, so that the system voltage $V_{DD}$ again charges the capacitor C, and the voltage level of the node A is pulled up to the high voltage level. Therefore, the P-type transistor MP2 is turned off, and the N-type transistor MN2 is turned on, so that the scan signal $SS_j$ output by the shift register $SR_j$ during the time section T4 has the low voltage level.

Since after the time section T4 of the same frame period, there is no condition for turning on the N-type transistor MN1, the voltage level of the node A is continually maintained to the high voltage level. Therefore, the P-type transistor MP2 is continually turned off, and the N-type transistor MN2 is continually turned on, so that the scan signal $SS_j$ output by the shift register $SR_j$ after the time section T4 is maintained to the low voltage level until the time section T2 of a next frame period. This is because during the time section T2 of the next frame period, there has a condition for turning on the N-type transistor MN1.

According to the aforementioned description of the operation principle of the shift register $SR_j$, those skilled in the art should be able to deduce a whole operation method of the shift register apparatus 201, and therefore detailed descriptions thereof are not repeated.

According to the above descriptions, each of the shift registers within the shift register apparatus 201 is merely constituted by four active elements (i.e. two P-type transistors and two N-type transistors) and one passive element (i.e. the capacitor) without using the conventional digital logic elements. Therefore, the layout area occupied/consumed by each of the shift registers of the above embodiment is relatively smaller than that of the conventional shift register constituted by the CMOS D-flip-flop.

Figure 5:
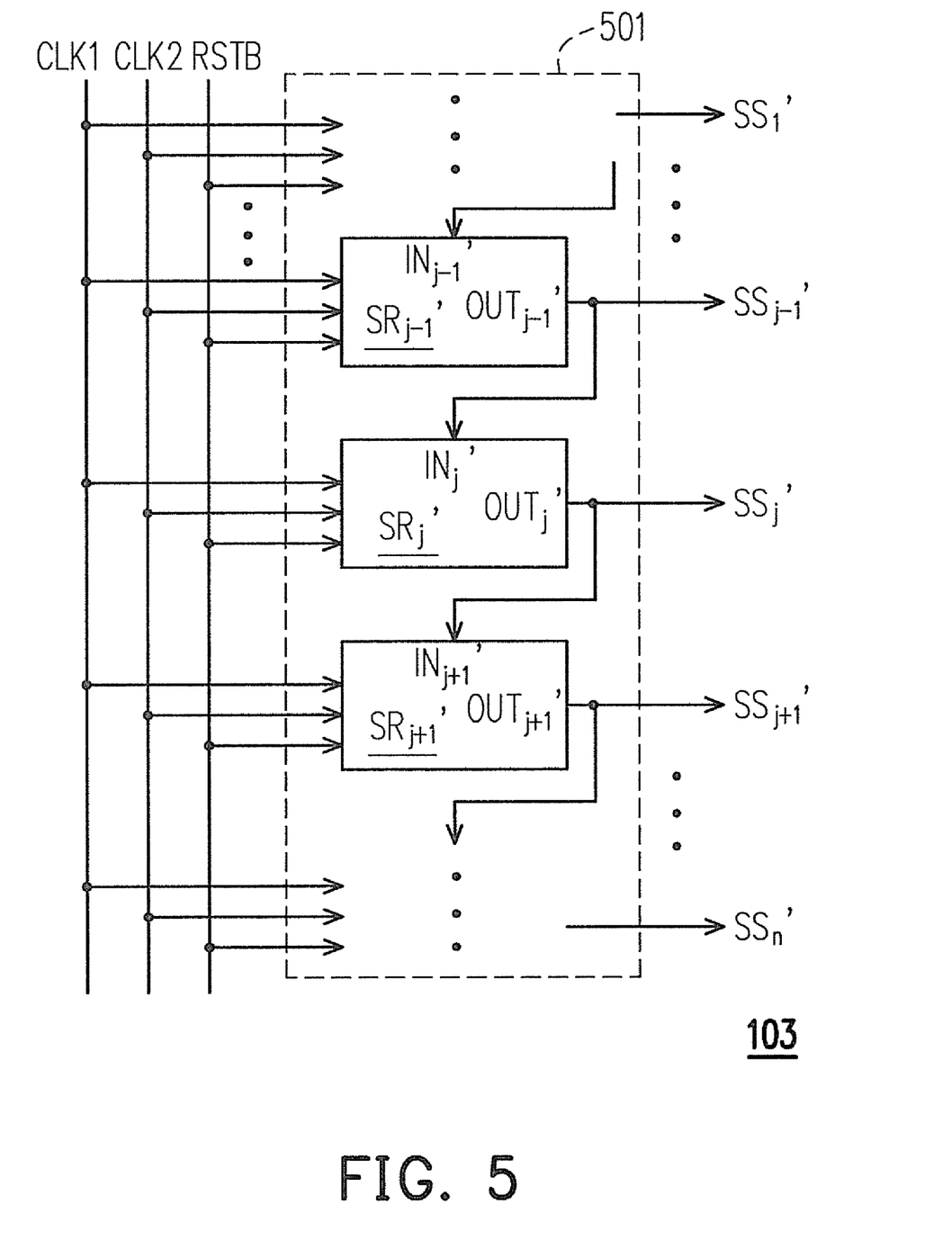
FIG. 5 is a schematic diagram of a shift register apparatus 501 according to another exemplary embodiment of the present invention.

FIG. 5 is a schematic diagram of a shift register apparatus 501 according to another exemplary embodiment of the present invention. Compared to the embodiment of FIG. 2, in the embodiment of FIG. 5, a reset signal RSTB is further input to the shift register apparatus 501.

Figure 6:
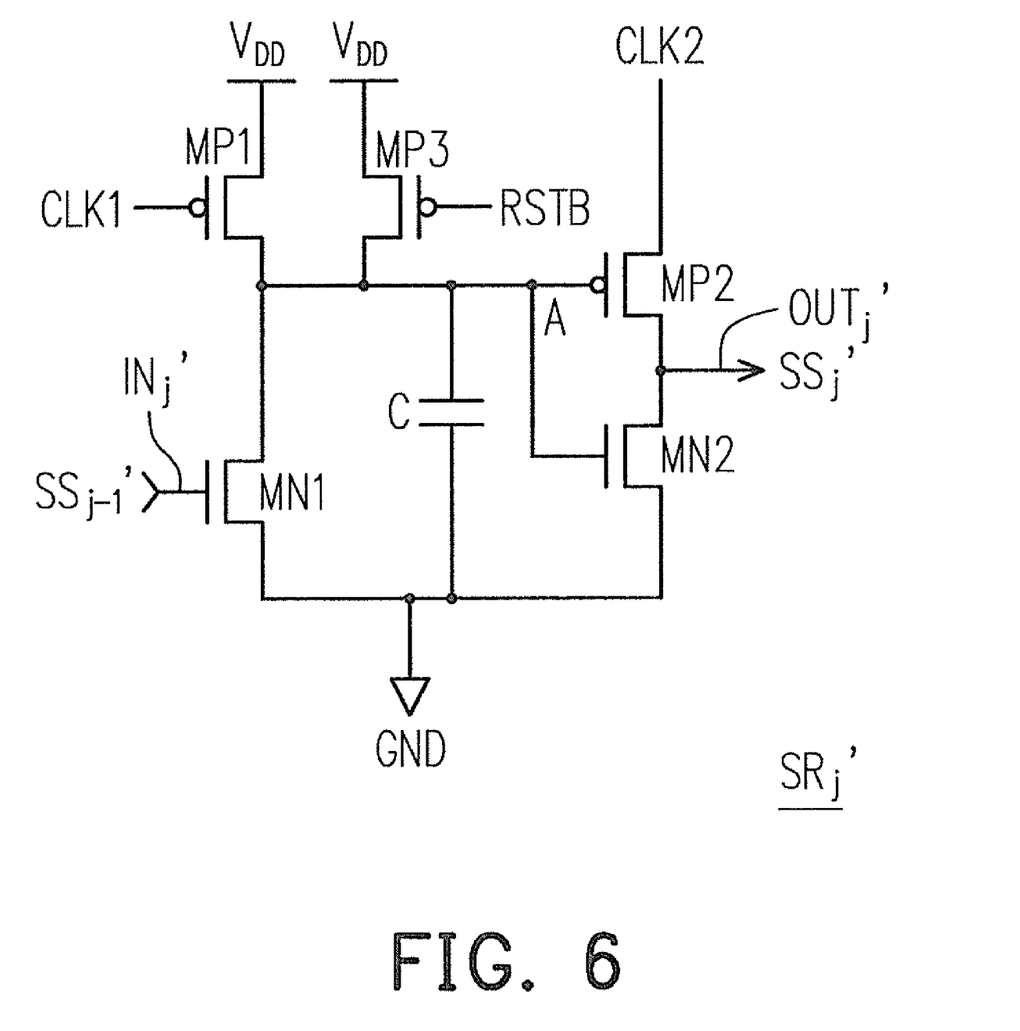
FIG. 6 is a circuit diagram of a shift register $SR_j'$ according to an exemplary embodiment of the present invention.

FIG. 6 is a circuit diagram of a shift register $SR_j'$ according to an exemplary embodiment of the present invention. Referring to FIGS. 3 and 6, it is obvious that the shift register $SR_j'$ of FIG. 6 further has a P-type transistor MP3 compared to the shift register $SR_j$ of FIG. 3. A gate of the P-type transistor MP3 receives the reset signal RSTB, a first drain/source of the P-type transistor MP3 receives the system voltage $V_{DD}$ and a second drain/source of the P-type transistor MP3 is coupled to the first terminal of the capacitor C.

An operation principle of the shift register $SR_j'$ of FIG. 6 is substantially similar to that of the shift register $SR_j$ of FIG. 3, and a difference there between is that by applying the P-type transistor MP3, the shift register $SR_j'$ of FIG. 6 may have a reset function. In detail, as long as the timing controller 107 (though the present invention is not limited thereto) provides the reset signal RSTB with a low voltage level to the gate of the P-type transistor MP3, the scan signal $SS_j'$ output by the shift register $SR_j'$ of FIG. 6 is forced to have the low voltage level.

Since the circuit structures and the operation principles of the shift registers within the shift register apparatus 501 are similar, the timing controller 107 can simultaneously send reset signal RSTB with the low voltage level to the gate of the P-type transistor MP3 within each of the shift registers, so as to initialize the shift register apparatus 501. By such means, a correct operation of the shift register apparatus 501 can be guaranteed.

Figure 7:
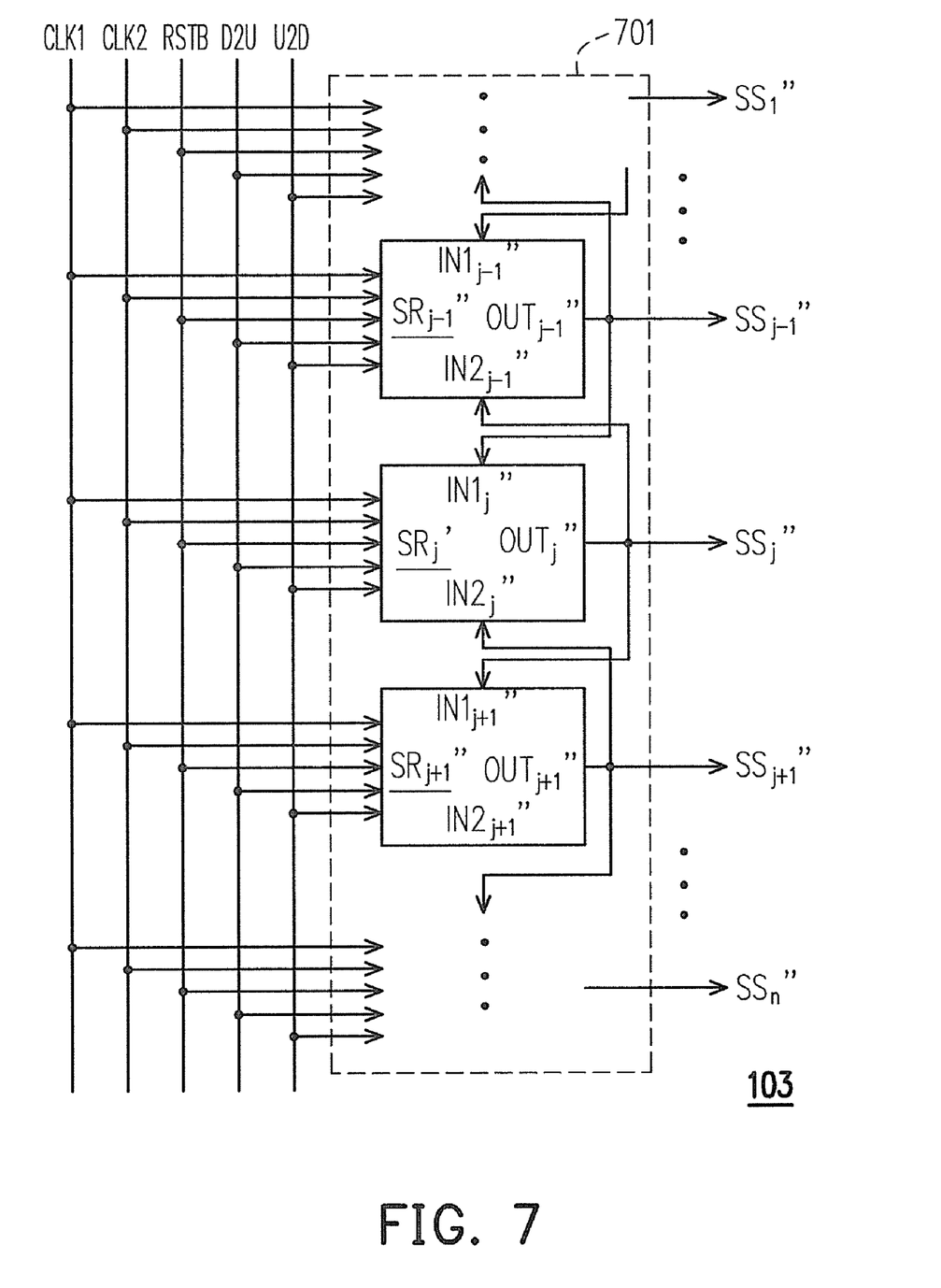
FIG. 7 is a schematic diagram of a shift register apparatus 701 according to another exemplary embodiment of the present invention.

FIG. 7 is a schematic diagram of a shift register apparatus 701 according to another exemplary embodiment of the present invention. Compared to the embodiment of FIG. 5, in the embodiment of FIG. 7, direction signals D2U and U2D are further input to the shift register apparatus 701.

Figure 8:
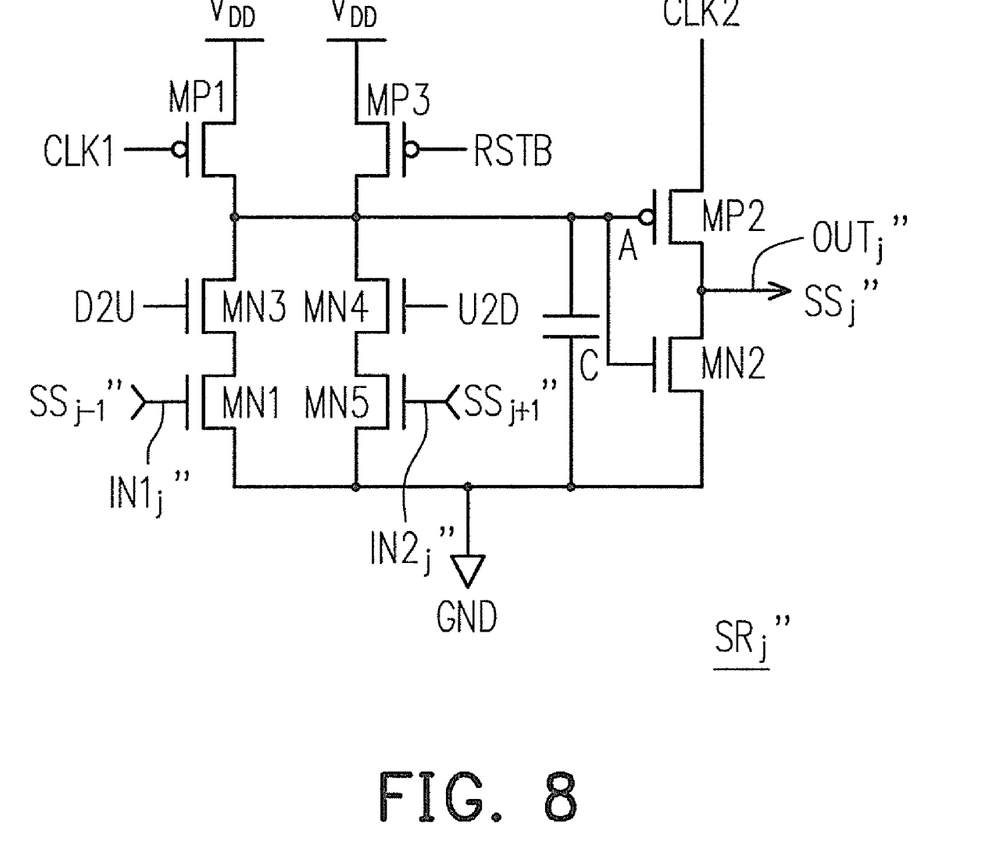
FIG. 8 is a circuit diagram of a shift register $SR_j''$ according to an exemplary embodiment of the present invention.

FIG. 8 is a circuit diagram of a shift register $SR_j''$ according to an exemplary embodiment of the present invention. Referring to FIG. 6 and FIG. 8, it is obvious that the shift register $SR_j''$ of FIG. 8 further has three N-type transistors MN3-MN5 compared to the shift register $SR_j'$ of FIG. 6. A gate of the N-type transistor MN1 serves as a first input terminal $IN1_j''$ of the shift register $SR_j''$. A gate of the N-type transistor MN3 receives the direction signal D2U, a first drain/source of the N-type transistor MN3 is coupled to the second drain/source of the P-type transistor MP1, and a second drain/source of the N-type transistor MN3 is coupled to the first drain/source of the N-type transistor MN1.

A gate of the N-type transistor MN4 receives the direction signal U2D having a 180 degrees phase difference with the direction signal D2U, and a first drain/source of the N-type transistor MN4 is coupled to the second drain/source of the P-type transistor MP3. A gate of the N-type transistor MN5 serves as a second input terminal $IN2_j''$ of the shift register $SR_j''$ and is coupled to an output terminal $OUT_{j+1}''$ of a shift register $SR_{j+1}''$, a first drain/source of the N-type transistor MN5 is coupled to the second drain/source of the N-type transistor MN4, and a second drain/source of the N-type transistor MN5 is coupled to the reference voltage (i.e. the ground voltage GND).

The operation principle of the shift register $SR_j''$ of FIG. 8 is substantially similar to that of the shift register $SR_j'$ of FIG. 6, and a difference there between is that by applying the N-type transistors MN3-MN5, the shift register $SR_j''$ of FIG. 8 may further achieve a bi-directional transmission function of the scan signals $SS_1''$-$SS_n''$. In detail, since the direction signals D2U and U2D have a phase difference of 180 degrees, when the direction signal D2U is enabled, the direction signal U2D is disabled, the scan signal $SS_j''$ output by the shift register $SR_j''$ can be transmitted to a first input terminal $IN1_{j+1}''$ of the next shift register $SR_{j+1}''$. Certainly, when the direction signal D2U is disabled, the direction signal U2D is enabled, the scan signal $SS_j''$ output by the shift register $SR_j''$ can be transmitted to a second input terminal $IN2_{j-1}''$ of a previous shift register $SR_{j-1}''$.

Since the circuit structures and the operation principles of the shift registers within the shift register apparatus 701 are similar, the timing controller 107 can simultaneously send an enabled direction signal D2U to the gate of the N-type transistor MN3 of each of the shift registers, and now the gates of the N-type transistors MN5 of the shift registers can simultaneously receive a disabled direction signal U2D from the timing controller 107. Therefore, the shift register apparatus 701 can sequentially generate the scan signals $SS_1''$-$SS_n''$.

Conversely, the timing controller 107 can also simultaneously send a disabled direction signal D2U to the gate of the N-type transistor MN3 of each of the shift registers, and now the gates of the N-type transistors MN5 of the shift registers can also simultaneously receive an enabled direction signal U2D from the timing controller 107. Therefore, the shift register apparatus 701 is changed to sequentially generate the scan signals $SS_n''$-$SS_1''$.

In addition, before the timing controller 107 transmits the direction signals D2U and U2D to the gates of the N-type transistors MN3 and MN5 of each of the shift registers (though the present invention is not limited thereto), the timing controller 107 can further simultaneously transmit the reset signal RSTB with a low voltage level to the gate of the P-type transistor MP3 of each of the shift registers, so as to initialize the shift register apparatus 701. By such means, the correct operation of the shift register apparatus 701 can be guaranteed.

Figure 9:
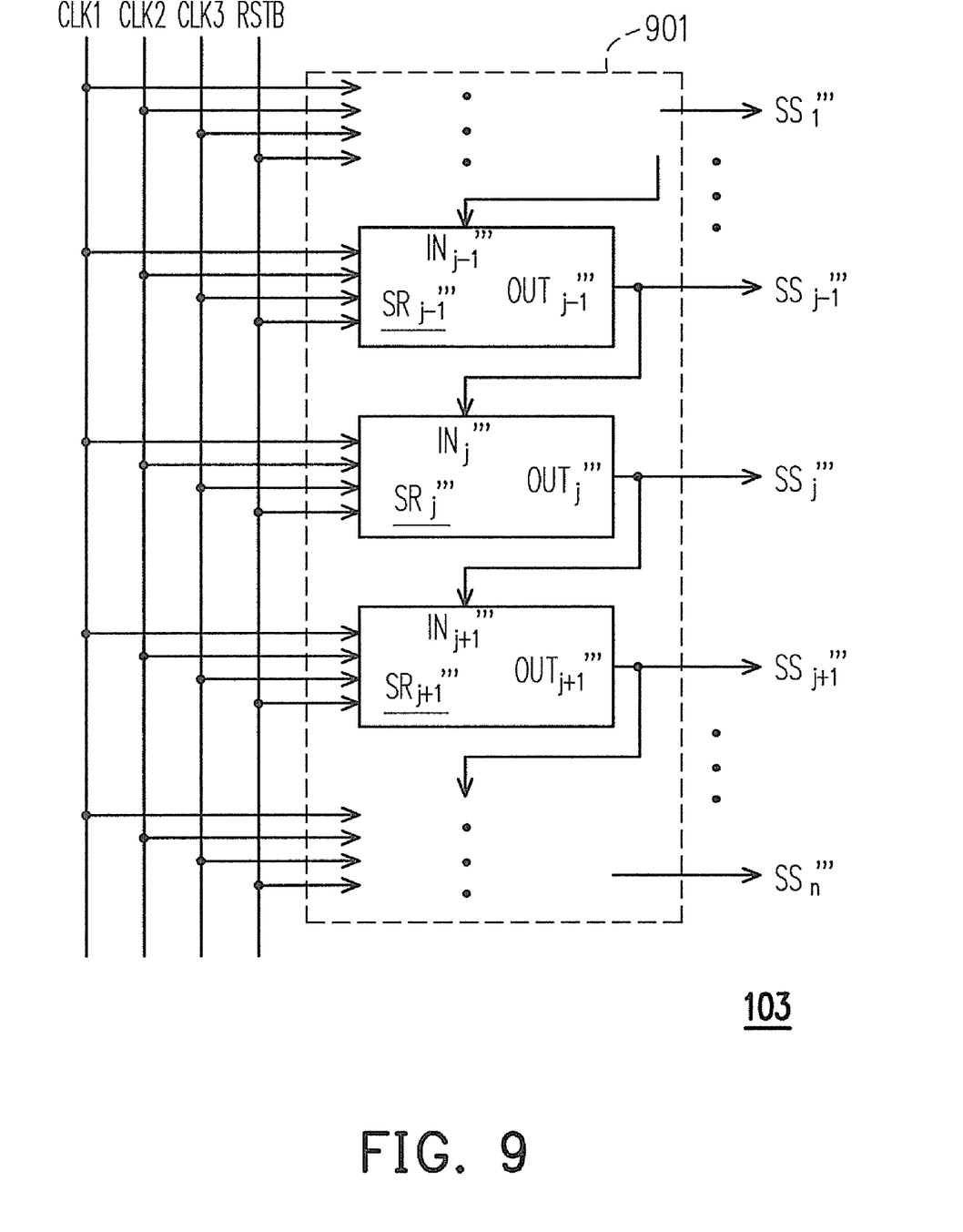
FIG. 9 is a schematic diagram of a shift register apparatus 901 according to another exemplary embodiment of the present invention.

FIG. 9 is a schematic diagram of a shift register apparatus 901 according to another embodiment of the present invention. Compared to the embodiment of FIG. 5, in the embodiment of FIG. 9, a clock signal CLK3 is further input to the shift register apparatus 901.

Figure 10:
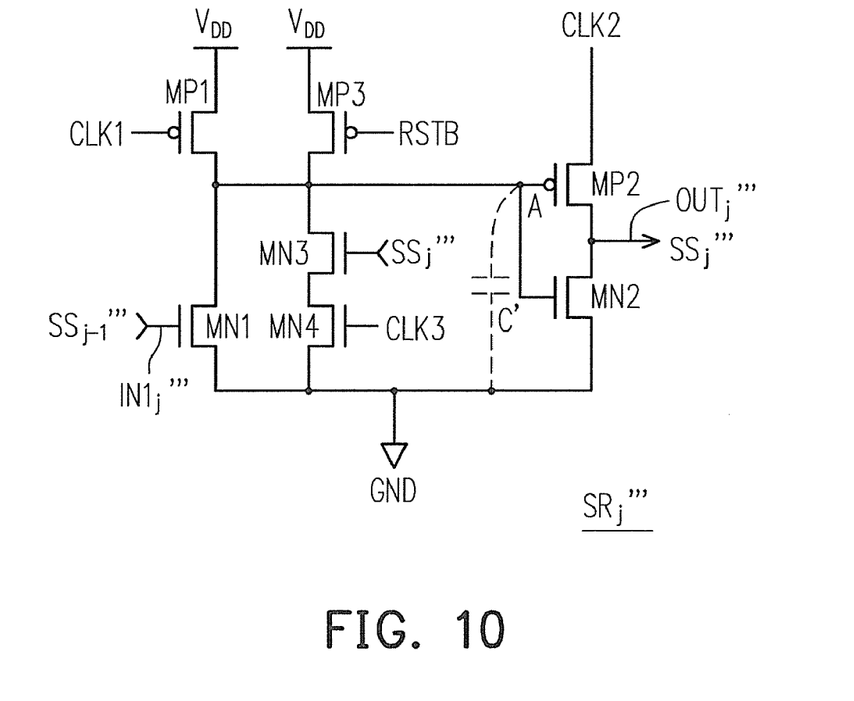
FIG. 10 is a circuit diagram of a shift register $SR_j'''$ according to an exemplary embodiment of the present invention.

FIG. 10 is a circuit diagram of a shift register $SR_j'''$ according to an embodiment of the present invention. Referring to FIGS. 1, 2 and 9, the shift register $SR_j'''$ includes the P-type transistors MP1-MP3, the N-type transistors MN1-MN4 and a capacitor C'. Wherein, the gate of the P-type transistor MP1 receives the clock signal CLK1, and the first drain/source of the P-type transistor MP1 receives the system voltage $V_{DD}$ of the LCD 100.

The gate of the N-type transistor MN1 serves as an input terminal $IN_j'''$ of the shift register $SR_j'''$ and is coupled to an output terminal $OUT_{j-1}'''$ of a shift register $SR_{j-1}'''$, the first drain/source of the N-type transistor MN1 is coupled to the second drain/source of the P-type transistor MP1, and the second drain/source of the N-type transistor MN1 is coupled to a reference voltage (for example, the ground voltage GND, though the present invention is not limited thereto).

The gate of the P-type transistor MP2 is coupled to the second drain/source of the P-type transistor MP1, the first drain/source of the P-type transistor MP2 receives the clock signal CLK2, and the second drain/source of the P-type transistor MP2 serves as an output terminal $OUT_j'''$ of the shift register $SR_j'''$. The gate of the N-type transistor MN2 is coupled to the gate of the P-type transistor MP2, the first drain/source of the N-type transistor MN2 is coupled to the second drain/source of the P-type transistor MP2, and the second drain/source of the N-type transistor MN2 is coupled to the reference voltage (i.e. the ground voltage GND).

In the present embodiment, there is a node A located on a coupling path between the second drain/source of the P-type transistor MP1 and the gate of the P-type transistor MP2, and the capacitor C' is a parasitic capacitor of the node A relative to the reference voltage (i.e. the ground voltage GND). A first terminal of the capacitor C' is coupled to the second drain/source of the P-type transistor MP1, and a second terminal of the capacitor C' is coupled to the reference voltage (i.e. the ground voltage GND). Moreover, the gate of the P-type transistor MP3 receives the reset signal RSTB, the first drain/source of the P-type transistor MP3 receives the system voltage $V_{DD}$, and the second drain/source of the P-type transistor MP3 is coupled to the first terminal of the capacitor C'.

The gate of the N-type transistor MN3 is coupled to the second drain/source of the P-type transistor MP2, and the first drain/source of the N-type transistor MN3 is coupled to the second drain/source of the P-type transistor MP1. The gate of the N-type transistor MN4 receives the clock signal CLK3, the first drain/source of the N-type transistor MN4 is coupled to the second drain/source of the N-type transistor MN3, and the second drain/source of the N-type transistor MN4 is coupled to the reference voltage (i.e. the ground voltage GND).

According to the aforementioned description of the circuit structure of the shift register $SR_j'''$, those skilled in the art should be able to deduce a whole structure of the shift register apparatus 901, and therefore detailed descriptions thereof are not repeated.

Figure 11:
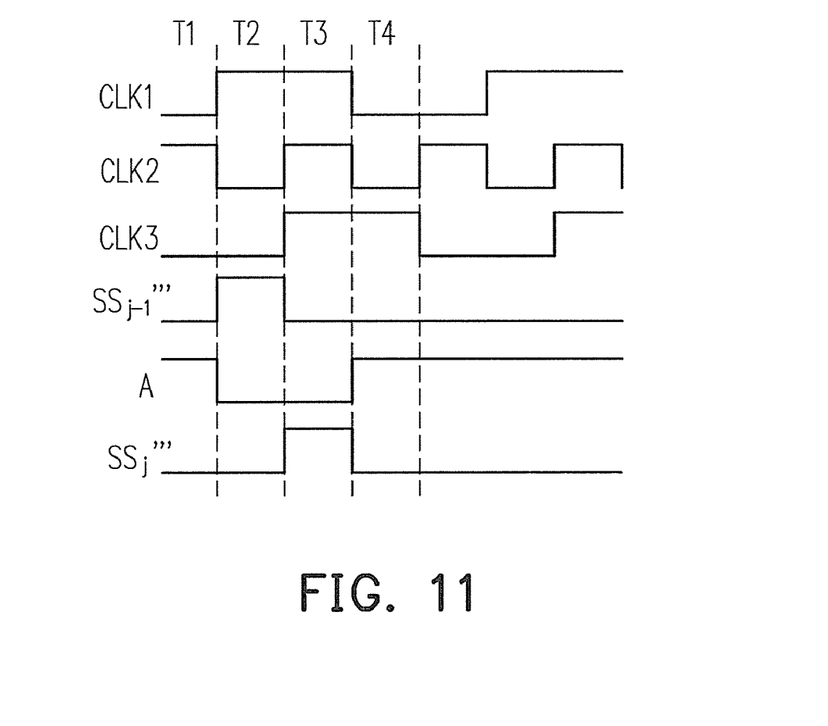
FIG. 11 is an operation timing diagram of a shift register $SR_j'''$ according to an exemplary embodiment of the present invention.

Moreover, FIG. 11 is an operation timing diagram of the shift register $SR_j'''$ according to an exemplary embodiment of the present invention. Referring to FIGS. 10 and 11, according to the operation timing diagram of FIG. 11, it is obvious that duty cycles of the clock signals CLK1 and CLK3 are the same, though the phase of the clock signal CLK3 falls behind the phase of the clock signal CLK1 for 90 degrees, and the cycle of the clock signal CLK1 or the clock signal CLK3 is twice the bigger than that of the clock signal CLK2. Operations of the shift register $SR_j'''$ during the time sections T1 and T2 are similar compared to the embodiment of FIG. 4, and therefore detailed descriptions thereof are not repeated.

During the time section T3 in a frame period, the clock signals CLK1-CLK3 all have the high voltage level, and the scan signal $SS_{j-1}'''$ output by the shift register $SR_{j-1}'''$ has the low voltage level. Therefore, the P-type transistor MP1 and the N-type transistor MN1 are all turned off, so that the voltage level of the node A is continually maintained to the low voltage level during the time section T3. Since the voltage level of the node A is continually maintained to the low voltage level during the time section T3, the P-type transistor MP2 is still turned on, and the N-type transistor MN2 is still turned off, so that the scan signal $SS_j'''$ output by the shift register $SR_j'''$ during the time section T3 has the high voltage level. Therefore, the N-type transistor MN3 is turned on, so as to continually maintain the voltage level of the node A to the low voltage level during the time section T3.

Next, during the time section T4 in the same frame period, the clock signals CLK1 and CLK2 all have the low voltage level, the clock signal CLK 3 has the high voltage level, and the scan signal $SS_{j-1}'''$ output by the shift register $SR_{j-1}'''$ also has the low voltage level. Therefore, the P-type transistor MP1 is turned on, so that the voltage level of the node A can be pulled up to the high voltage level. Therefore, the P-type transistor MP2 is turned off, and the N-type transistor MN2 is turned on, so that the scan signal $SS_j'''$ output by the shift register $SR_j'''$ during the time section T4 has the low voltage level.

Since after the time section T4 of the same frame period, there is no condition for turning on the N-type transistor MN1, the voltage level of the node A is continually maintained to the high voltage level. Therefore, the P-type transistor MP2 is continually turned off, and the N-type transistor MN2 is continually turned on, so that the scan signal $SS_j'''$ output by the shift register $SR_j'''$ after the time section T4 is maintained to the low voltage level until the time section T2 of a next frame period. This is because during the time section T2 of the next frame period, there has a condition for turning on the N-type transistor MN1.

Figure 12:
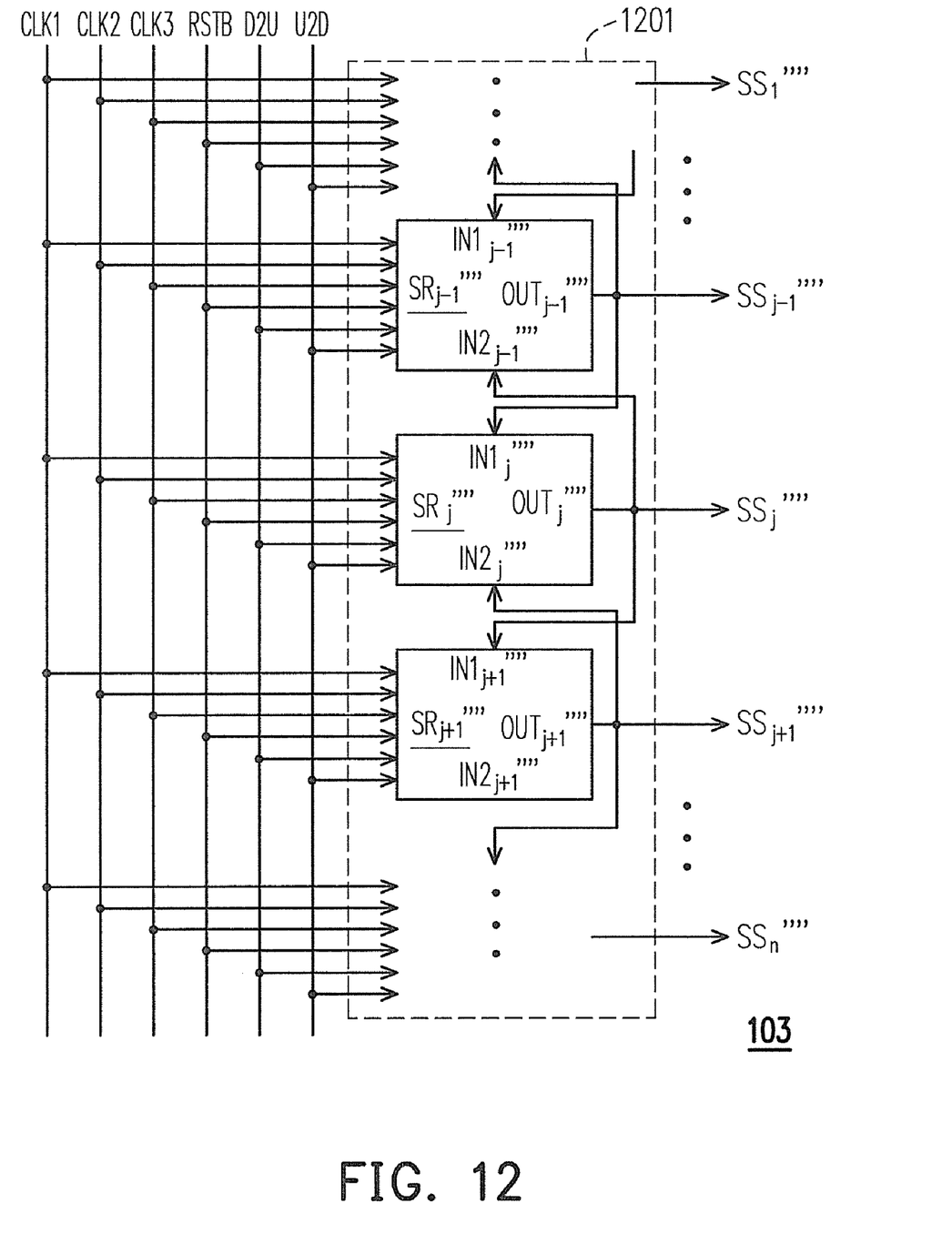
FIG. 12 is a schematic diagram of a shift register apparatus 1201 according to another exemplary embodiment of the present invention.

FIG. 12 is a schematic diagram of a shift register apparatus 1201 according to another exemplary embodiment of the present invention. Compared to the embodiment of FIG. 7, in the embodiment of FIG. 12, the clock signal CLK3 is further input to the shift register apparatus 1201.

Figure 13:
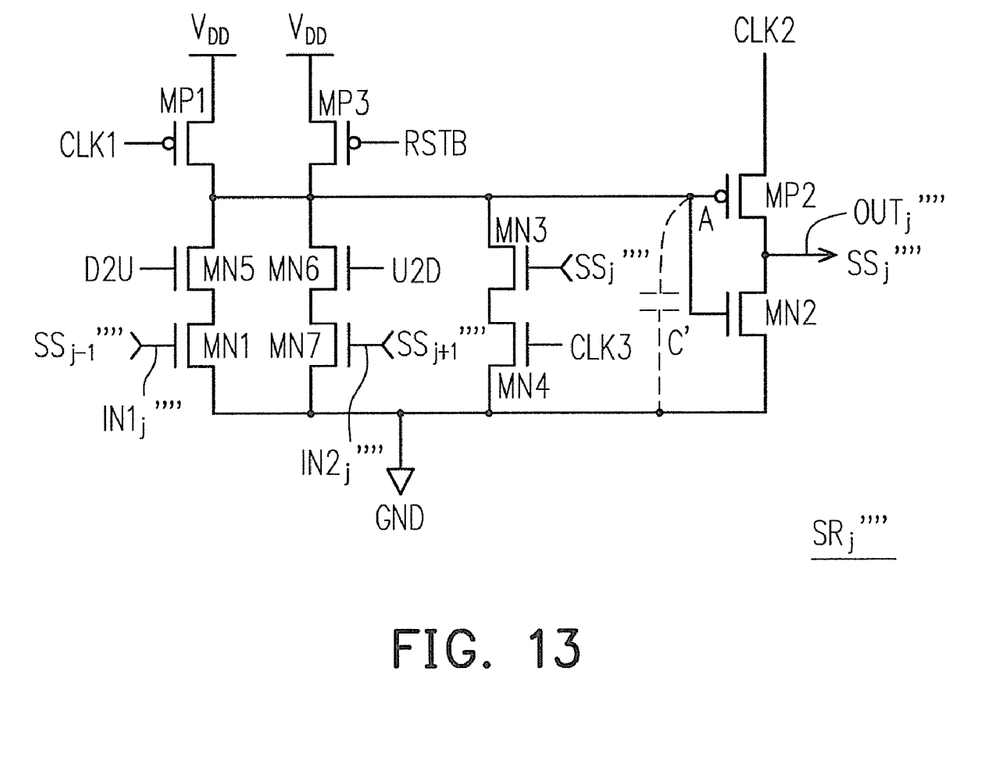
FIG. 13 is a circuit diagram of a shift register $SR_j''''$ according to an exemplary embodiment of the present invention.

FIG. 13 is a circuit diagram of a shift register $SR_j''''$ according to an embodiment of the present invention. Referring to the embodiments of FIG. 8 and FIG. 10, the embodiment of FIG. 13 combines the features of the above two embodiments, so that the bi-directional transmission function, and a function of controlling the capacitor C' (i.e. the parasitic capacitor) through the clock signal CLK3 are achieved. As shown in FIG. 10 and FIG. 13, those skilled in the art can deduce a detail operation of the shift register $SR_j''''$ according to the aforementioned embodiments, and therefore detail descriptions thereof are not repeated.

In summary, each of the shift registers within the shift register apparatus is merely constituted by a few of active and passive elements (i.e. the P-type and N-type transistors and the capacitors) without using the conventional digital logic elements, and even the passive elements are not required at some conditions. Therefore, the layout area occupied/consumed by each of the shift registers of the present invention is relatively smaller than that of the conventional shift register constituted by the CMOS D-flip-flop, and thus the fabrication cost can be reduced.

Besides, as long as the shift register apparatus of any above embodiment is used, it is construed to be within the scope of the present invention. Moreover, the N-type transistors illustrated in FIG. 3, FIG. 6, FIG. 8, FIG. 10 and FIG. 13 can be changed to the P-type transistors, and the P-type transistors can also be changed to the N-type transistors, according which only the operation timing is required to be varied. Such variation and modification are also considered to be within the scope of the present invention.

It will be apparent to those skilled in the art that various modifications and variations (for example, the operation timing and voltage level of the shift register can be changed according to actual design requirements) can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register apparatus, comprising:
a plurality of shift registers connected in serial, each of the shift registers having a first input terminal and an output terminal, wherein the output terminal of an i-th shift register is coupled to the first input terminal of an (i+1)-th shift register, i is a positive integer, and the i-th shift register comprises:
a first transistor, having a gate receiving a first clock signal, and a first drain/source receiving a first voltage;
a second transistor, having a gate serving as the first input terminal of the i-th shift register and coupled to the output terminal of an (i−1)-th shift register, a first drain/source coupled to a second drain/source of the first transistor, and a second drain/source coupled to a second voltage;
a capacitor, having a first terminal coupled to the second drain/source of the first transistor, and a second terminal coupled to the second voltage;
a third transistor, having a gate coupled to the first terminal of the capacitor, a first drain/source receiving a second clock signal, and a second drain/source serving as the output terminal of the i-th shift register; and
a fourth transistor, having a gate coupled to the gate of the third transistor, a first drain/source coupled to the second drain/source of the third transistor, and a second drain/source coupled to the second voltage,
wherein the first transistor and the third transistor are respectively a first-type transistor, and the second transistor and the fourth transistor are respectively a second-type transistor.

2. The shift register apparatus as claimed in claim 1, wherein the i-th shift register further comprises:
a fifth transistor, having a gate receiving a reset signal, a first drain/source receiving the first voltage, and a second drain/source coupled to the first terminal of the capacitor, wherein the fifth transistor is the first-type transistor.

3. The shift register apparatus as claimed in claim 2, wherein a cycle of the first clock signal is at least twice the bigger than that of the second clock signal.

4. The shift register apparatus as claimed in claim 2, wherein the shift registers coupled in serial respectively have a second input terminal.

5. The shift register apparatus as claimed in claim 4, wherein the i-th shift register further comprises:
a sixth transistor, having a gate receiving a first direction signal, a first drain/source coupled to the second drain/source of the first transistor, and a second drain/source coupled to the first drain/source of the second transistor;
a seventh transistor, having a gate receiving a second direction signal, and a first drain/source coupled to the second drain/source of the fifth transistor; and
an eighth transistor, having a gate serving as the second input terminal of the i-th shift register and coupled to the output terminal of an (i+1)-th shift register, a first drain/source coupled to a second drain/source of the seventh transistor, and a second drain/source coupled to the second voltage,
wherein the sixth transistor, the seventh transistor and the eighth transistor are all the second-type transistor.

6. The shift register apparatus as claimed in claim 5, wherein a phase difference between the first direction signal and the second direction signal is 180 degrees.

7. The shift register apparatus as claimed in claim 2, wherein there is a node located on a coupling path between the second drain/source of the first transistor and the gate of the third transistor, and the capacitor is a parasitic capacitor of the node relative to the second voltage.

8. The shift register apparatus as claimed in claim 7, wherein the i-th shift register further comprises:
a sixth transistor, having a gate coupled to the second drain/source of the third transistor, and a first drain/source coupled to the second drain/source of the first transistor; and
a seventh transistor, having a gate receiving a third clock signal, a first drain/source coupled to a second drain/source of the sixth transistor, and a second drain/source coupled to the second voltage,
wherein the sixth transistor and the seventh transistor are all the second-type transistor.

9. The shift register apparatus as claimed in claim 8, wherein a duty cycle of the third clock signal is the same to that of the first clock signal, and a phase of the third clock signal falls behind the phase of the first clock signal for 90 degrees.

10. The shift register apparatus as claimed in claim 8, wherein the shift registers coupled in serial respectively have a second input terminal.

11. The shift register apparatus as claimed in claim 10, wherein the i-th shift register further comprises:
an eighth transistor, having a gate receiving a first direction signal, a first drain/source coupled to the second drain/source of the first transistor, and a second drain/source coupled to the first drain/source of the second transistor;
a ninth transistor, having a gate receiving a second direction signal, and a first drain/source coupled to the second drain/source of the fifth transistor; and
a tenth transistor, having a gate serving as the second input terminal of the i-th shift register and coupled to the output terminal of an (i+1)-th shift register, a first drain/ source coupled to a second drain/source of the ninth transistor, and a second drain/source coupled to the second voltage, wherein the eighth transistor, the ninth transistor and the tenth transistor are all the second-type transistor.

12. The shift register apparatus as claimed in claim 11, wherein a phase difference between the first direction signal and the second direction signal is 180 degrees.

13. The shift register apparatus as claimed in claim 1, wherein the first voltage at least comprises a system voltage, and the second voltage at least comprises a ground voltage.

14. The shift register apparatus as claimed in claim 1, wherein the first-type transistor is a P-type transistor, and the second-type transistor is an N-type transistor.

15. The shift register apparatus as claimed in claim 1, wherein the first-type transistor is an N-type transistor, and the second-type transistor is a P-type transistor.

16. A gate driving having a shift register apparatus as claimed in claim 1, used for driving a liquid crystal display (LCD) panel.

17. A LCD panel having a gate driver as claimed in claim 16.

* * * * *